United States Patent
Saksa et al.

(10) Patent No.: US 7,442,408 B2
(45) Date of Patent: Oct. 28, 2008

(54) METHODS FOR INK-JET PRINTING CIRCUITRY

(75) Inventors: Thomas A. Saksa, Albany, OR (US); John M. Da Cunha, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 823 days.

(21) Appl. No.: 10/107,886

(22) Filed: Mar. 26, 2002

(65) Prior Publication Data

US 2003/0185971 A1 Oct. 2, 2003

(51) Int. Cl.
*B05D 3/00* (2006.01)

(52) U.S. Cl. .................. 427/189; 427/160; 427/191; 427/192

(58) Field of Classification Search .............. 427/96, 427/123, 126.3, 189, 197, 199
See application file for complete search history.

(56) References Cited

U.S. PATENT DOCUMENTS

| | | | | |
|---|---|---|---|---|
| 3,391,455 A | * | 7/1968 | Hirohata et al. | ............... 29/852 |
| 3,948,812 A | | 4/1976 | Corren et al. | |
| 3,950,200 A | | 4/1976 | Muramoto et al. | |
| 3,960,779 A | | 6/1976 | Rosenblatt | |
| 4,234,626 A | * | 11/1980 | Peiffer | ........................ 430/319 |
| 4,268,536 A | * | 5/1981 | Beckenbaugh et al. | ...... 427/558 |
| 4,276,204 A | | 6/1981 | Chester | |
| 4,278,702 A | * | 7/1981 | Jenq | ........................... 427/543 |
| 4,401,686 A | * | 8/1983 | Durand | ........................ 427/474 |
| 4,411,980 A | * | 10/1983 | Haney et al. | ................. 430/291 |
| 4,485,387 A | * | 11/1984 | Drumheller | .............. 346/140.1 |
| 4,668,533 A | * | 5/1987 | Miller | ........................ 427/98 |
| 4,774,106 A | * | 9/1988 | Kozono | ....................... 427/202 |
| 4,853,252 A | * | 8/1989 | Frankel et al. | ............... 427/596 |
| 5,014,420 A | * | 5/1991 | Howard et al. | ................. 29/846 |
| 5,045,141 A | | 9/1991 | Salensky et al. | |
| 5,114,744 A | * | 5/1992 | Cloutier et al. | ............... 427/96 |
| 5,421,926 A | | 6/1995 | Yukinobu et al. | |
| 5,582,769 A | | 12/1996 | Lovell | |
| 5,716,663 A | | 2/1998 | Capote et al. | |
| 5,897,912 A | * | 4/1999 | Shaikh | ........................ 427/79 |
| 6,021,050 A | | 2/2000 | Ehman et al. | |
| 6,045,977 A | * | 4/2000 | Chandross et al. | .......... 430/311 |
| 6,132,646 A | | 10/2000 | Zhou et al. | |
| 6,165,386 A | | 12/2000 | Endo et al. | |
| 6,487,774 B1 | * | 12/2002 | Nakao et al. | ................ 29/890.1 |

* cited by examiner

*Primary Examiner*—Timothy Meeks
*Assistant Examiner*—Kelly M Stouffer

(57) ABSTRACT

The present invention is drawn toward a method of forming conductive paths on a substrate using ink-jet technology. An ink-jettable suspension or solution can be formed containing a conductive particulate having certain desired conductive properties. The suspension can then be ink-jetted onto a substrate such as ceramic, epoxy glass, or other materials in a given pattern using various ink-jet printing technologies and methods. Depending on the chosen conductive particulates, suspension components, and substrate, the printed pattern of conductive particulates may then be heated to further enhance the conductive properties of the particulates through bonding and/or sintering.

17 Claims, No Drawings

METHODS FOR INK-JET PRINTING CIRCUITRY

FIELD OF THE INVENTION

The present invention relates to using ink-jet technology to adhere conductive materials on a variety of substrates. More particularly, the present invention relates to the ink-jet printing of circuitry.

BACKGROUND OF THE INVENTION

Printing of conductive materials has been accomplished in many different ways. Further, various methods for manufacturing printed circuit boards are known. In recent years, new methods have been developed to form thin metallic layers to be used as antenna elements or other electrical circuit components, in particular by applying a conductive liquid, sometimes referred to as a conductive paint or ink, onto a substrate or support member.

One such method is the print and etch method. This method is used particularly for producing printed circuit boards where the conductive paths are applied only to one side of the board, for example, printed circuits with low packing density. Additionally, the print and etch method can be carried out using a board of non-conductive material with a copper layer laminated to one or both sides of the board. The conductive structures of the printed circuit board may be applied by using, for example, screen-printing or photographic methods, e.g., applying photoresist, exposing, and developing.

Another very common current circuit printing method is screen-printing. This type of printing device generally comprises a silk screen plate set on an insulating base board to be printed, and an ink delivery device which runs on the screen plate while delivering a given amount of viscous conductive ink including a binder, often referred to as thick-film, onto the screen plate and pressing the same against the insulating base board. With this, on the surface of the insulating base board, there is printed a desired circuit pattern of the conductive ink that coincides with a perforated print pattern formed in the screen plate. The base board can then be heated for fixing the printed circuit pattern. The screen plate is usually constructed of a stainless steel, silk, or the like. However, there are drawbacks with screening methods related to the additional steps of cleaning the printed surface and screen, drying, achieving uniform thickness, and the wasting of excess paste.

Other methods of applying conductive materials to a surface include dipping, flooding, brushing, and spraying. For example, mixed powders slurried in water may be applied to a substrate by spraying or painting. The applied material can then be dried and heated at high temperature to yield a conductive glaze. Methods commonly used in the semiconductor fabrication industry include evaporation, sputtering, and traditional chemical vapor disposition.

Thermal ink jet printers are known to provide an effective means of propelling ink-jet inks onto various media. These printers can accomplish this by using resistive heater elements for heating the ink to a boil, and propelling the ink through an overlying orifice plate. There are several reasons that ink-jet printing has become a popular way of recording images on various media surfaces. Some of these reasons include low printer noise, capability of high-speed recording, multi-color recording, and a relatively low consumer price. However, though there has been great improvement in ink-jet printing, accompanying this improvement are increased demands by consumers in this area, e.g., higher speeds, higher resolution, full color image formation, increased stability, new applications, etc. Several of such new applications are provided herein.

SUMMARY OF THE INVENTION

The methods of the present invention provide simple, inexpensive, and effective means of printing conductive materials on a variety of substrates using ink-jet ink technology. More particularly, the present invention provides a method of forming a conductive path on a substrate comprising the steps of providing conductive particulates, a liquid vehicle, and a substrate; forming a suspension comprising the liquid vehicle and the particulate conductive material such that the suspension is ink-jettable; jetting from an ink-jet pen a predetermined pattern of the suspension onto a substrate; and heating the substrate with the suspension ink-jetted thereon to a temperature wherein the conductive particulates are bound and adhere to the substrate and provide the conductive path.

In accordance with a more detailed aspect of the present invention, the method includes using conductive particulates from 0.1 µm to 20 µm. Such conductive particulates may include metal oxides, bronze, metal silicides, brass, nickel, chromium, copper, gold, and combinations of these particulates.

In accordance with another more detailed aspect of the present invention, the method includes the use of only water as a liquid vehicle for the conductive particulates. The ink-jettable suspension can also include the use of dyes, pigments, dopants, adhesives, binders, fixers, thermosetting resins, glazes, low melting-point alloys, co-solvents, biocides, buffers, viscosity modifiers, surfactants, and other vehicle components.

In accordance with yet another more detailed aspect of the present invention, the heating of the printed conductive particulates is sufficient to cause sintering of the particulates.

Further, a method of forming a conductive path on a substrate can comprise the steps of providing organic conductive polymers, a liquid vehicle, and a substrate; forming an ink-jettable solution comprising the organic conductive polymers and the liquid vehicle; jetting from an ink-jet pen a predetermined pattern of the solution onto the substrate; and heating the substrate with the solution ink-jetted thereon to a temperature wherein the conductive polymers are bound and adhere to the substrate and provide the conductive path.

A method of forming a conductive path on a substrate is also disclosed and can comprise the steps of providing metal or metal oxide salts, a liquid vehicle, and a substrate; forming a solution comprising the liquid vehicle and the metal or metal oxide salts such that the metal or metal oxide salts dissolve forming a solution that is ink-jettable; jetting from an ink-jet pen a predetermined pattern of the solution onto a substrate; and heating the substrate with the solution ink-jetted thereon in a reducing atmosphere to a temperature wherein the metal and metal oxide salts are reduced to their metallic state and adhere to the substrate and to form the conductive path.

An alternative embodiment of the present invention includes a method of creating a pattern of conductive particulates on a substrate comprising the steps of ink-jetting an adhesive material onto a substrate in a desired pattern; distributing conductive particulates onto the substrate such that a portion of the conductive particulates adhere to the adhesive material; removing excess conductive particulates; and heating the substrate containing the pattern of conductive particulates to a temperature wherein the conductive particulates are fused and adhere to the substrate.

With each of the above methods, though a heating step is preferred, alternatively, this heating step can be replaced with a drying step at much lower temperatures, including room temperatures.

Additional features and advantages of the invention will be apparent from the following detailed description which illustrates, by way of example, features of the invention.

DETAILED DESCRIPTION OF THE INVENTION

For the purposes of promoting an understanding of the principles of the invention, reference will now be made to exemplary embodiments, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

In describing and claiming the present invention, the following terminology will be used.

The singular forms "a," "an," and, "the" include plural referents unless the context clearly dictates otherwise. Thus, for example, reference to "a dye" includes reference to one or more of such dyes.

As used herein, "effective amount" refers to the minimal amount of a substance or agent, which is sufficient to achieve a desired result. For example, an effective amount of a "liquid vehicle" is the minimum amount required in order to create a conductive particulate suspension, while maintaining properties necessary for effective ink-jetting.

As used herein, "liquid vehicle," refers to the composition in which conductive particulates are added to provide ink-jettable suspension compositions. A wide variety of liquid vehicles may be used with the methods of the present invention including a mixture of a variety of different agents. Such agents can include, without limitation, dopants, adhesives, binders, fixers, thermosetting resins, dispersants such as polymethacrylate copolymers, phosphate esters, lignosulfates, glazes, low melting-point alloys such as cerobend, viscosity modifiers such as polyoxyethers, solvents, co-solvents, buffers, biocides, chelating agents, surfactants such as alkoxy surfactants, water, and other vehicle components.

A "colorant" includes dyes and pigments.

An "aqueous suspension" or "suspension" comprises a liquid vehicle, conductive particulates, and optionally, a colorant.

As used herein, "adhesive material" refers to any material which is capable of adhering to a substrate, maintaining its form, and holding conductive particulates in place upon contact therewith.

As used herein, "bonding" or "binding" of the conductive particulates refers to a process which fixes the particles in a position such that an electrical current may pass through neighboring particulates to create a conductive pathway. The bonding may occur through simple or mechanical contact or creating metallurgical bonds between neighboring particulates, such as occurs through sintering.

"Binder" can include any material that acts to bind conductive particulates on a substrate. Examples of binder can include compositions such as polyvinyl alcohol, carboxymethyl cellulose, starches, epoxies, urethanes, acrylates, adhesives, gums such as gum Arabic, agars, organic oils such as clove oil or oil of lavender, and the like. If the binder is used in a method where firing occurs, then it is preferred that the binder be one that does not produce significant amounts of ash. For example, gum Arabic, agar, clove oil, and oil of lavender will burn off leaving minimal ash residue.

"Sinter" or "sintering" involves the heating of metal particulates to their respective melting point to form metallurgical joints between the particulates.

The present invention is drawn to the use of conductive particulates that can be made to be ink-jettable such that the conductive particulates can be deposited onto a substrate using an ink-jet pen. Antennas and circuit printing are two examples of fields that may benefit from use of such a system. For example, printing cellular phone antennas could be simply and effectively accomplished using this method.

In order to produce a conductive ink, conductive particulates are integrated into the ink system. Pigments and/or dyes can be optionally added if the desire is to visualize the conductive path being created. As a practical matter, in order for an ink to be conductive, conductive particulates should be present in the ink matrix such that the individual particles are large enough and/or close enough together to functionally allow for current flow. Additionally, there are several characteristics to consider when evaluating a liquid vehicle for use in conjunction with a printing surface or substrate. Such characteristics include edge acuity and optical density of the image on the surface, dry time of the ink on the substrate, adhesion to the substrate, lack of deviation of ink droplets, presence of all dots, resistance of the ink after drying to water and other solvents, long term storage stability, and long term reliability without corrosion or nozzle clogging. Though the above list of characteristics provides a worthy goal to achieve, there are difficulties associated with satisfying all of the above characteristics. Often, the inclusion of an ink component meant to satisfy one of the above characteristics can prevent another characteristic from being met. Thus, the selected composition for use in ink-jet printers can represent a compromise in an attempt to achieve at least an adequate response in meeting some of the above listed requirements. No matter what conductive material is used to create the conductive ink, by selecting the appropriate liquid vehicle components, e.g., water, polymers, surfactants, etc., easy processing, good adhesion, and high mechanical and chemical resistance can be achieved.

With this in mind, a method of forming a conductive path on a substrate can comprise the steps of providing conductive particulates, a liquid vehicle, and a substrate; forming a suspension comprising the liquid vehicle and the particulate conductive material such that the suspension is ink-jettable; jetting from an ink-jet pen a predetermined pattern of the suspension onto a substrate; and heating the substrate with the suspension ink-jetted thereon to a temperature wherein the conductive particulates are bound and adhere to the substrate and provide the conductive path.

In accordance with one aspect of the present invention, a conductive path is formed on a substrate by forming a suspension that is ink-jettable. In order to satisfy the requirements of ink-jetting, the suspension will generally include a liquid vehicle in which the conductive particles are suspended. The liquid vehicle may comprise materials such as, but are not limited to, dopants, adhesives, binders, fixers, thermosetting resins, dispersants such as polymethacrylate copolymers, phosphate esters, and lignosulfates, glazes, low melting-point alloys such as cerobend, viscosity modifiers such as polyoxyethers, solvents, co-solvents, buffers, biocides, chelating agents, surfactants such as alkoxy surfactants, water, and other vehicle components. Optionally, to the liquid vehicle, can be added a colorant such as a dye or a pigment if the desire is to provide a printed circuit that is more visible or colored for color-coding or identification purposes.

Of the solvents or co-solvents that can be used, several compositions and combinations of compositions can be selected. For example, appropriate solvents and/or co-solvents can include water, ethanol, methylethyl ketone, 2-pyrrolidone, trimethyl propanol, glycols such as ethylene glycol, diethylene glycol, triethylene glycol and tetraethylene glycol, glycerol and related derivatives such as polyethoxylated glycerols, lactams such as N-methyl pyrrolidone, lactones such as butyrolactone, alkanolamines, such as diethanolamine and triethanolamine, diols such as 1,2-pentanediol, 1,2-propanediol, 1,3-propanediol, 1,2-butanediol, 2,3-butanediol, 1,4-butanediol, and hexylene glycol (2-methyl-2,4-pentanediol), other isomers of pentanediol and hexanediol such as 1,5-pentanediol and 1,6-hexanediol, triols such as 1,2,6-hexanetriol, mono- and di-glycol ethers such as ethylene glycol monobutyl ether, imidazoles such as 1,3-dimethyl-2-imidazolidinone sulfones such as dimethylsulfone, tetramethylene sulfone, and 2,2'-sulfonyldiethanol, organo-sulfoxides such as methylsulfoxide, organosulfides such as 2,2'-thiodiethanol, trimethylolpropane, triethylolethane, urea and its derivatives, the like, and mixtures thereof. In one embodiment, water can be the only solvent used. Thus, in its most basic form, the method can be carried out using a suspension comprising water and a metallic particulate or powder. Further, if a binder is added to the composition, then appropriate binders or additives can include polyvinyl alcohol, carboxymethyl cellulose, or starches, to name a few.

The conductive particulate material can be selected based on desired conductive properties and may be either highly conductive, semi-conductive, or resistive. Further, conductivity can be modulated to some extent by altering the concentration of conductive particulates present in the liquid vehicle. Examples of conductive particulates that can be used include metal oxides, metal silicides, brass, nickel, chromium, bronze, copper, gold, silver, aluminum, platinum, palladium, beryllium, rhodium, cobalt, iron, molybdenum, zinc, boron, gallium, indium, antimony, bismuth, tellurium, manganese, phosphorous, tungsten, carbon, and mixtures thereof. Such conductive particulates as those used in printing hybrid circuits are typical. In order to ink-jet such a suspension, the particulates are typically present in the suspension at from 3% to 5% by weight of the total suspension, while the broader range of about 1 to 10% by weight can be implemented for use as well. Particulate sizes in the range of 0.1 $\mu$m to 20 $\mu$m can also be used to provide acceptable jettability. Of course smaller particles could be used and result in potentially finer resolution, but such a modification would likely also increase the overall expense of the process. The suspension can then be placed in an ink-jet compatible pen or cartridge with an orifice size of between about 3 $\mu$m and 45 $\mu$m. The desired pattern may then be designed using any number of software applications and then printed using known ink-jet techniques on a provided substrate. The printed pattern may be a completed conducting pathway or printed such that further components such as transistors and other connections may be added later.

In accordance with the present invention, a variety of substrates may be used including ceramics such as pre-fired green ceramics, epoxy glass, MYLAR™, high temperature electro-compatible plastics such as KAPTON™, hybrid-circuit base board, phenolic materials and cellulose based substrates to name a few. The substrate should be chosen based on the intended use, and operating conditions, and which is within the expertise of those skilled in the art.

Alternatively, a method of creating a pattern of conductive material on a substrate can comprise the steps of ink-jetting an adhesive material onto a substrate in a desired pattern; distributing conductive particulates onto the substrate such that a portion of the conductive particulates adhere to the adhesive material; removing excess conductive particulates; and heating the substrate containing a pattern of conductive particulates to a temperature wherein the conductive particulates are fused and adhere to the substrate. Thus, the ink-jettable composition includes a binder or an adhesive, but no conductive particulates. The ink-jettable adhesive material is ink-jetted onto a substrate in a desired pattern. A conductive particulates, chosen as described previously, are then distributed on the substrate causing a portion of the particulates to adhere to the printed suspension. Various techniques such as ramping or shaking can be used to distribute the conductive particulates on the substrate. The excess conductive particulates can then be removed from the substrate.

With respect to each of the methods described herein, depending on the characteristics of the ink-jettable composition after printing, heating will likely be desired. However, a conductive pathway may also be created by causing electrical or thermal contact between particulates, such as by close proximity, rendering heating unnecessary.

If heat is used, then heating may be accomplished in a variety of ways known in the art, such as with firing in a kiln, furnace, oven, ultraviolet light, or any other method of raising the temperature sufficient to effectuate providing conductive properties of the printed pathway. The conductive properties of the pathway may be improved through heating to improve mechanical contact through bonding or sintering. Mechanical contact may be enhanced through the use of binders and/or adhesives. An adhesive or other carrier may be used which evaporates or is burned off during the heating step, which can cause a reduction in volume resulting in the conductive particulates moving closer together. Further, either metallic or non-metallic binders can be used which can provide desired conductive properties. Suspensions containing conductive metal particulates may also be sintered to create a continuous conductive pathway.

Alternatively, transient liquid-phase sintering (TLPS) is a similar process involving a mixture of higher and lower melting-point metals. In TLPS the mixture is heated to the melting temperature of the lower melting-point metal that melts and diffuses into the higher melting point metal. This can result in a new alloy having an entirely different melting point.

In accordance with the present invention, the substrate having the suspension printed thereon can be fired in a kiln at from 500° C. to 1400° C. for from 1 to 72 hours, to achieve sintering or TLPS. However, in some embodiments, a higher temperature of up to 4000° C. can be implemented in the process. Conversely, some printed materials may require less time and/or heat to achieve the desired conducting pathway. Further, consideration should be given as to potential damage to the substrate during extended heating. Such considerations of temperature and time are deemed well within the skill of those in the art. The above described methods currently provide for line widths about 254 $\mu$m (10 mils) and greater. However, smaller line widths may be possible by decreasing particle size, orifice size of the ink-jet pen, and/or drop size.

In accordance with a further detailed aspect of the present invention, the liquid vehicle can contain a binder which, upon heating or drying, adheres the particulates to the substrate and to each other in such a way that the conductive particles are in contact with each other forming a conductive path.

Alternatively, a method of forming a conductive path on a substrate can comprise the steps of providing organic conductive polymers, a liquid vehicle, and a substrate; forming an ink-jettable solution comprising the organic conductive polymers and the liquid vehicle; jetting from an ink-jet pen a predetermined pattern of the solution onto the substrate; and heating or drying the substrate with the solution ink-jetted thereon to a temperature wherein the conductive polymers are bound and adhere to the substrate and provide the conductive path.

In yet another more detailed aspect of the present invention, a method of forming a conductive path on a substrate can comprise the steps of providing metal or metal oxide salts, a liquid vehicle, and a substrate; forming a solution comprising the liquid vehicle and the metal or metal oxide salts such that the metal or metal oxide salts dissolve forming a solution that is ink-jettable; jetting from an ink-jet pen a predetermined pattern of the solution onto a substrate;, and heating the substrate with the solution ink-jetted thereon in a reducing atmosphere to a temperature wherein the metal and metal oxide salts are reduced to their metallic state and adhere to the substrate and to form the conductive path. These embodiments, as well as others, are meant to show various methods that can be practiced in accordance with the principles of the present invention.

While the invention has been described in accordance with the preferred embodiment, other steps can be used with similar results. For example, though a heating step is preferred, alternatively, this heating step can be replaced with a drying step at much lower temperatures. For example, allowing the suspension or the adhesive material to dry at ambient temperature can provide acceptable results with some conductive-particulate formulations.

EXAMPLES

The following examples illustrate several embodiments of the present invention. However, other embodiments may be practiced that are considered within the scope of the present invention. Further, the following examples should not be considered as limitations of the present invention, but should merely teach the methods of the present invention.

Example 1

An ink-jettable composition was formed using water as a liquid vehicle and copper particulates of about 10 μm diameter comprising 5% by weight of the total composition. The composition was placed in an ink-jet pen having a 20 μm orifice. A one (1) mm line-width circuit pattern was then printed from the pen onto a green ceramic. The printed ceramic was fired in a kiln resulting in an electrically conductive path.

Example 2

An ink-jettable adhesive composition was formed using water and about 5% by total composition weight of gum Arabic as a binder. A linear pattern was printed on a green ceramic substrate. To the printed pattern was sprinkled an excess of powdered silver conductive particulates. The conductive particulates that did not adhere to the adhesive composition were removed by ramping. The ceramic having the conductive particulates adhered thereto was fired in a kiln at 1800° C. for 30 seconds. The fired circuit pattern was electrically conductive.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, changes, omissions, and substitutions may be made without departing from the principles and concepts of the invention as set forth in the claims.

What is claimed is:

1. A method of forming a conductive path on a substrate comprising the steps of:
   providing conductive particulates, a liquid vehicle, and a substrate;
   forming a suspension comprising the liquid vehicle and the conductive particulates such that the suspension is ink-jettable;
   jetting from an ink-jet pen a predetermined pattern of the suspension onto a substrate; and
   heating the substrate with the suspension ink-jetted thereon to a temperature wherein the conductive particulates are bound and adhere to the substrate, thereby providing the conductive path without the requirement of an additional deposition step.

2. A method as in claim 1, wherein the conductive particulates are selected from the group consisting of metal oxides, metal suicides, brass, nickel, chromium, bronze, copper, gold, and combinations thereof.

3. A method as in claim 2, wherein the conductive particulates are bronze.

4. A method as in claim 2, wherein the conductive particulates are a metal oxide.

5. A method as in claim 2, wherein the conductive particulates are from 0.1 μm to 20 μm.

6. A method as in claim 2, wherein the conductive particulates are present from 1% to 10% by weight of the suspension.

7. A method as in claim 2, wherein the conductive particulates are present from 3% to 5% by weight of the suspension.

8. A method as in claim 1, wherein the liquid vehicle comprises components selected from the group consisting of water, surfactants, dispersants, co-solvents, and mixtures thereof.

9. A method as in claim 8, wherein the suspension consists essentially of water and the conductive particulates.

10. A method as in claim 1, wherein the substrate is ceramic.

11. A method as in claim 1, wherein the substrate is epoxy glass.

12. A method as in claim 1, wherein the heating step heats the substrate to temperatures sufficient to sinter the conductive particulates.

13. A method as in claim 1, wherein the jetting step further comprises jetting a plurality of suspensions of differing conductivity, each suspension using a separate ink-jet orifice.

14. A method as in claim 1, wherein the aqueous suspension further comprises a colorant selected from the group consisting of pigments, dyes, and combinations thereof.

15. A method of forming a conductive path on a substrate comprising the steps of:
   providing conductive particulates, a liquid vehicle, and a substrate;
   forming a suspension comprising the liquid vehicle and the particulate conductive material such that the suspension is ink-jettable; and
   jetting from an ink-jet pen a predetermined pattern of the suspension onto a substrate wherein the conductive particulates are present in proximity to one another to provide the conductive path; and allowing the suspension to substantially dry on the substrate without added heat.

16. A method of forming a conductive path on a substrate comprising the steps of:

providing organic conductive polymers, a liquid vehicle, and a substrate;

forming an ink-jettable solution comprising the organic conductive polymers and the liquid vehicle;

jetting from an ink-jet pen a predetermined pattern of the solution onto the substrate; and heating the substrate with the solution ink-jetted thereon to a temperature wherein the conductive polymers are bound and adhere to the substrate and provide the conductive path.

17. A method of forming a conductive path on a substrate comprising the steps of:

providing metal or metal oxide salts, a liquid vehicle, and a substrate;

forming a solution comprising the liquid vehicle and the metal salts or metal oxides such that the metal salts or metal oxides dissolve forming a solution that is ink-jettable;

jetting from an ink-jet pen a predetermined pattern of the solution onto a substrate; and heating the substrate with the solution ink-jetted thereon in a reducing atmosphere to a temperature wherein the metal salts or metal oxides are reduced to their metallic state and adhere to the substrate and to form the conductive path.

* * * * *